United States Patent
Agarwal et al.

(10) Patent No.: US 7,750,511 B2
(45) Date of Patent: Jul. 6, 2010

(54) METHOD AND APPARATUS FOR SELF-CONTAINED AUTOMATIC DECOUPLING CAPACITOR SWITCH-OUT IN INTEGRATED CIRCUITS

(75) Inventors: Vikas Agarwal, Austin, TX (US); Asit S. Ambekar, Austin, TX (US); Sanjay Dubey, Austin, TX (US); Saiful Islam, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 551 days.

(21) Appl. No.: 11/733,435

(22) Filed: Apr. 10, 2007

(65) Prior Publication Data

US 2008/0251888 A1  Oct. 16, 2008

(51) Int. Cl.
H02H 3/00 (2006.01)
(52) U.S. Cl. .................................... 307/131
(58) Field of Classification Search ........... 307/131
See application file for complete search history.

(56) References Cited

U.S. PATENT DOCUMENTS

| | | | |
|---|---|---|---|
| 5,506,457 A | | 4/1996 | Krauter |
| 5,828,259 A | * | 10/1998 | Cases et al. ............... 327/376 |
| 6,307,250 B1 | | 10/2001 | Krauter |
| 6,844,771 B1 | | 1/2005 | Chen |
| 7,098,523 B2 | | 8/2006 | Chen |

OTHER PUBLICATIONS

QI—"On-Chip Decoupling Capacitor Budgeting By Sequence of Linear Programming", Proc. IEEE ASICON05 (2005).

* cited by examiner

Primary Examiner—Fritz M Fleming
Assistant Examiner—Dru M Parries
(74) Attorney, Agent, or Firm—Diana Gerhardt; Mark P Kahler

(57) ABSTRACT

An integrated circuit (IC) includes power supply interconnects that couple to a power source. The integrated circuit includes electronic devices that perform desired functions and further includes decoupling capacitor circuits that provide noise reduction throughout the integrated circuit. In one embodiment, each decoupling capacitor circuit includes a decoupling capacitor and a switching circuit. The switching circuit connects the decoupling capacitor to the power supply interconnects during a connect mode when the switching circuit detects no substantial decoupling capacitor leakage. However, the switching circuit effectively disconnects the decoupling capacitor from the power supply interconnects during a disconnect mode when the switching circuit detects substantial decoupling capacitor leakage. The decoupling capacitor circuit self-initializes in the connect mode without external control signals and is thus self-contained. Because of the self-contained nature of the decoupling capacitor circuit, an integrated circuit may contain an array of decoupling capacitor circuits without expenditure of substantial chip real estate for respective decoupling capacitor control lines.

19 Claims, 4 Drawing Sheets

METHOD AND APPARATUS FOR SELF-CONTAINED AUTOMATIC DECOUPLING CAPACITOR SWITCH-OUT IN INTEGRATED CIRCUITS

TECHNICAL FIELD OF THE INVENTION

The disclosures herein relate to integrated circuit (IC) chips, and more particularly, to integrated circuit (IC) chips employing noise dampening decoupling capacitors.

BACKGROUND

Modern ICs may include thousands, millions and even higher numbers of electronic devices such as transistors. As these electronic devices turn on and off in an (IC) chip, electric current flow changes in power conductors near these electronic devices. A change in current flow near the electronic devices induces voltage or power supply noise within the IC. Power supply interconnects or power conductors such as conductive layers, traces, or other conductive interconnects within the IC distribute power supply signals. Electronic devices in the IC connect to the power supply interconnects, namely power (VDD) and ground (GND) under normal operation. Power supply noise is a concern of all chip designers in modern IC or semiconductor die manufacturing design. IC designers design integrated decoupling capacitors between the power supply interconnects, namely positive supply voltage (VDD) and zero voltage potential ground (GND). Connecting decoupling capacitors between the power supply interconnects within the integrated circuit is one method to reduce power supply noise. A decoupling capacitor acts as a temporary current source to provide power when a proximate electronic device pulls power from the power supply interconnect of the IC.

IC designers may use integrated devices, such as NMOS (n-type metal oxide semiconductor) transistors to fabricate decoupling capacitors within the IC. NMOS transistors typically contain an oxide layer that provides a semiconductor path for the electrical current that the decoupling capacitor uses, namely for power supply interconnect noise reduction. The oxide layer effectively acts as a dielectric layer for the integrated decoupling capacitor. Unfortunately, oxide layers, generally made of SiO2 (silicon dioxide) are subject to shorts or high leakage currents due to manufacturing defects, degradation of the oxide layer from use, or other physical parameters which may adversely affect the oxide layer. A bad oxide layer may result in the reduction or loss of decoupling capacitance and ultimately result in decoupling capacitor failure. Designers may fabricate a larger oxide layer to accommodate more current and thus make the decoupling capacitor more immune to failure. However, the larger the oxide layer, the more real estate (useable area of the IC) that the decoupling capacitor consumes. Larger oxide layers may also require specialized fabrication processes that cause the manufacturing process to be more complex and potentially more costly. It is a challenging trade-off for designers to minimize the oxide layer size and yet attain high decoupling capacitor yield. Decoupling capacitance degradation can further reduce the performance and yield of entire integrated circuit chips and adversely affect IC manufacturing.

To reduce the impact of decoupling capacitor failure in the IC, IC designers may include the ability to disconnect or switch-out bad decoupling capacitors within the IC. One method to switch-out decoupling capacitors is with an electronic switching signal, typically a binary on/off signal. Chip designers design electronic switch circuits that connect to respective decoupling capacitors to allow for the effective electronic removal of decoupling capacitors from the overall IC. A dedicated decoupling capacitor electronic switch circuit may remove the source of either power or ground from a particular bad decoupling capacitor to effectively remove the decoupling capacitor from the power supply interconnect of the IC. However, it is not feasible in a large scale integrated circuit to employ a dedicated decoupling capacitor switch circuit and dedicated capacitor switch signal for each decoupling capacitor of the IC. Dedicated switch signals would require multiple interconnects which use up valuable IC real estate. One approach for dealing with this problem is to group a collection of decoupling capacitors together by design logic rules to reduce the number of switching signals that the group of decoupling capacitors needs for switch out on the IC. Each decoupling capacitor still has a dedicated switch, but the group of decoupling capacitors shares a common switch signal. When one switch signal toggles to a negative state, a group of decoupling capacitors switches out of the circuit. Unfortunately, to switch out one bad decoupling capacitor, this method requires switching out all of the decoupling capacitors in the group. This is a major disadvantage of this method. When the electronic switching circuitry removes a group of decoupling capacitors, the effect is an undesirable larger decrease in noise reduction ability than the removal of only the bad decoupling capacitor itself.

As the performance requirements of integrated circuit chips increase, the need for more effective integrated decoupling capacitors rises as well. One purpose of integrated decoupling capacitors is to dampen the power supply noise levels across the power supply interconnects of the integrated circuit. Degradation of the decoupling capacitors on the IC will reduce the overall noise reduction potential of the IC and can eventually result in a total loss of the integrated circuit.

What is needed is a method and apparatus that addresses the problems associated with managing integrated decoupling capacitors in integrated circuits as described above.

SUMMARY

Accordingly, in one embodiment, a method is disclosed for decoupling electronic devices in an integrated circuit. The method includes providing the integrated circuit with a plurality of electronic devices situated on a semiconductor die. The method also includes providing a self-contained switchable decoupling capacitor (SCSDC) circuit adjacent at least one of the plurality of electronic devices. The method further includes coupling the SCSDC circuit between first and second power supply interconnects adjacent the at least one of the plurality of electronic devices. The SCSDC circuit includes a decoupling capacitor that couples to a switching circuit internal to the SCSDC circuit. The switching circuit operates in a connect mode to connect the decoupling capacitor to the first and second power supply interconnects and in a disconnect mode to disconnect the decoupling capacitor from at least one of the first and second power supply interconnects. Thereafter, the operation of the SCSDC circuit is controlled by 1) self-initializing, by the SCSDC circuit, the switching circuit in the connect mode when power is applied to the first and second power supply interconnects; 2) monitoring, by the switching circuit within the SCSDC circuit, leakage across the decoupling capacitor in the SCSDC circuit; and 3) switching, by the switching circuit, to the disconnect mode in response to the monitoring step detecting leakage across the decoupling capacitor.

In another embodiment, an integrated circuit is disclosed that includes a semiconductor die and a plurality of electronic devices situated on the semiconductor die. The integrated circuit also includes first and second power supply interconnects adjacent at least one of the plurality of electronic devices. The integrated circuit further includes a self-contained switchable decoupling capacitor (SCSDC) circuit adjacent the at least one of the plurality of electronic devices, the SCSDC circuit being coupled between the first and second power supply interconnects. The SCSDC circuit includes a decoupling capacitor. The SCSDC circuit also includes a switching circuit, coupled to the decoupling capacitor, wherein the switching circuit operates in a connect mode to connect the decoupling capacitor to the first and second power supply interconnects and in a disconnect mode to disconnect the decoupling capacitor from at least one of the first and second power supply interconnects. The SCSDC circuit self-initializes the switching circuit in the connect mode when power is applied to the first and second power supply interconnects. The switching circuit monitors leakage across the decoupling capacitor so that in response to detecting leakage across the decoupling capacitor the switching circuit switches to the disconnect mode.

BRIEF DESCRIPTION OF THE DRAWINGS

The appended drawings illustrate only exemplary embodiments of the invention and therefore do not limit its scope because the inventive concepts lend themselves to other equally effective embodiments.

DETAILED DESCRIPTION

Designers typically fabricate integrated decoupling capacitors as transistors in an integrated circuit (IC) chip to provide a desirable decoupling capacitance effect. Decoupling capacitors provide noise reduction across the power supply interconnects of the IC. A power supply interconnect typically includes positive voltage (VDD) and zero potential ground (GND) connections. A power source provides the VDD voltage potential. The power source may be an on-chip battery, an external power supply, or any power source or sources that generate a voltage potential across the power supply interconnects of the IC.

Figure 1:
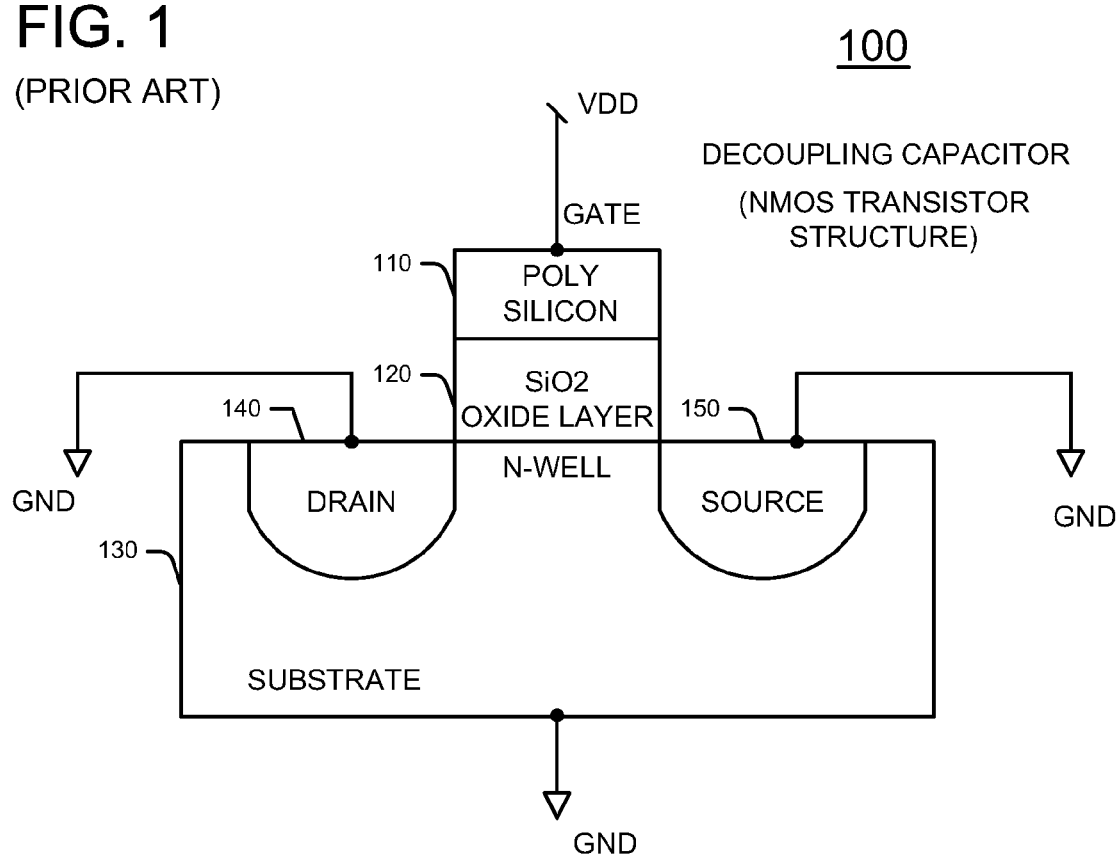
FIG. 1 shows a representation of a typical conventional decoupling capacitor in an integrated circuit MOS substrate.

FIG. 1 is a cross section of a conventional decoupling capacitor 100 structure for use in conventional integrated circuits. Designers may fabricate the representative decoupling capacitor 100 using NMOS (N-type metal oxide semiconductor) technology. The basic structure of decoupling capacitor 100 is an NMOS transistor. A polysilicon layer 110 couples to a source VDD that provides power to decoupling capacitor 100. The polysilicon layer 110 represents the gate terminal of the NMOS transistor and thus the gate terminal of decoupling capacitor 100. A silicon dioxide ($SiO_2$) oxide layer 120, shown as the "oxide layer", couples to the polysilicon layer 110 to provide a path for current from source VDD to the remaining structures of decoupling capacitor 100. The oxide layer 120 couples to a substrate 130, namely a silicon slab that contains a doping agent, in this example, N type material to support an NMOS transistor structure. A similar substrate structure with a P type doping material may form a PMOS version of the device (not shown). The substrate 130 couples to GND of the power supply interconnect of the IC chip. A drain 140 and a source 150 are regions within substrate 130 with different material doping than substrate 130. Drain 140 and source 150 each couple to GND. The area of the substrate in proximity to oxide layer 120 is known as the N-well. The area between the drain 140 and the source 150 represents the N-well region and provides the path for electron or current flow between surrounding structures of decoupling capacitor 100. Designers typically fabricate oxide layer 120 thicker than oxide layers for other transistors in an IC to provide for higher current flow and a more robust design. The larger the oxide layer, the less likely it will break down with use. However, making the oxide layer thicker than the rest of the silicon dioxide layer of the IC becomes more and more difficult as the individual device sizes shrink with regards to IC chip fabrication. One challenge to designers is to reduce the thickness of this oxide layer without a significant increase in leakage on the IC. Ideally, all transistors on an IC would exhibit the same oxide layer thickness for best manufacturing fabrication practices.

Figure 2:
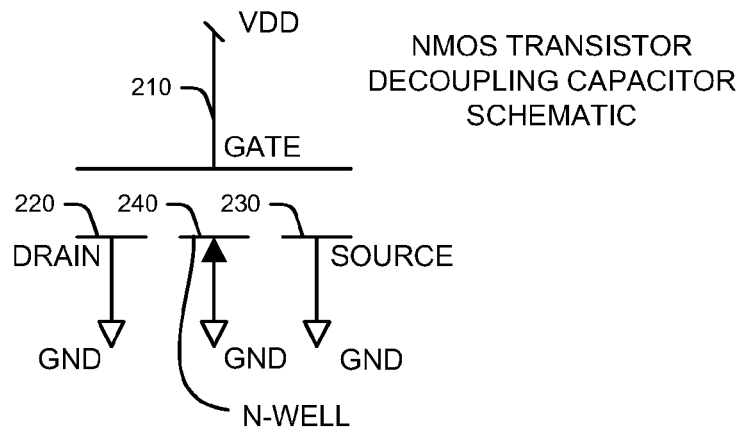
FIG. 2 shows a circuit schematic of a typical conventional decoupling capacitor usable in an integrated circuit.

FIG. 2 is a schematic diagram for a typical conventional NMOS transistor 200 that is acceptable for use as decoupling capacitor 100 of FIG. 1. The schematic NMOS transistor decoupling capacitor 200 includes a gate connection 210 that couples to voltage source VDD, a drain 220 that couples to GND, and a source 230 that couples also to GND. In this example, N-well 240 couples to GND and represents a connection to the N-well substrate of decoupling capacitor 200. The N-well 240 substrate connection may not always be shown depending upon the use of the NMOS transistor. Often the schematic does not show the substrate connection when the substrate shares connectivity with other schematic devices because the substrate typically couples to ground. When designers connect multiple transistors within multiple layers of an IC structure, it may be beneficial to show the interconnection between the source of one transistor and other connection points within the IC. If the oxide layer of decoupling capacitor 200 breaks down, leakage current flows through decoupling capacitor 200 from VDD voltage from the gate 210 to GND. This leakage current is on at all times when voltage source VDD supplies voltage to decoupling capacitor 200. This breakdown in the oxide layer represents both a waste of power supply current as well as a loss of the noise reduction ability of decoupling capacitor 200.

Decoupling capacitors may employ circuitry, namely current flow control circuitry to reduce the leakage through bad oxide layers of decoupling capacitors. Some prior methods employ multiple transistors to switch-off the path of the decoupling capacitor to power or ground and thus reduce or eliminate leakage current. Prior methods required the use of an external control signal or reset at power-on to initially charge and control the decoupling capacitor. More control signals require multiple interconnect wiring (traces) on the IC and result in a loss of valuable IC real estate. As described above, grouping multiple decoupling capacitors is one method to reduce the interconnect wiring proliferation problem. However, this method requires that groups switch-out collectively and any control of one decoupling capacitor affects the entire group. As decoupling capacitor count on the IC degrades, the noise reduction effects degrade as well. The clock speed of an IC may also depend on the decoupling capacitor count. The larger the number of decoupling capacitors, the faster the clock frequency may run on an IC without adverse impact from electronic device switching noise.

Figure 3:
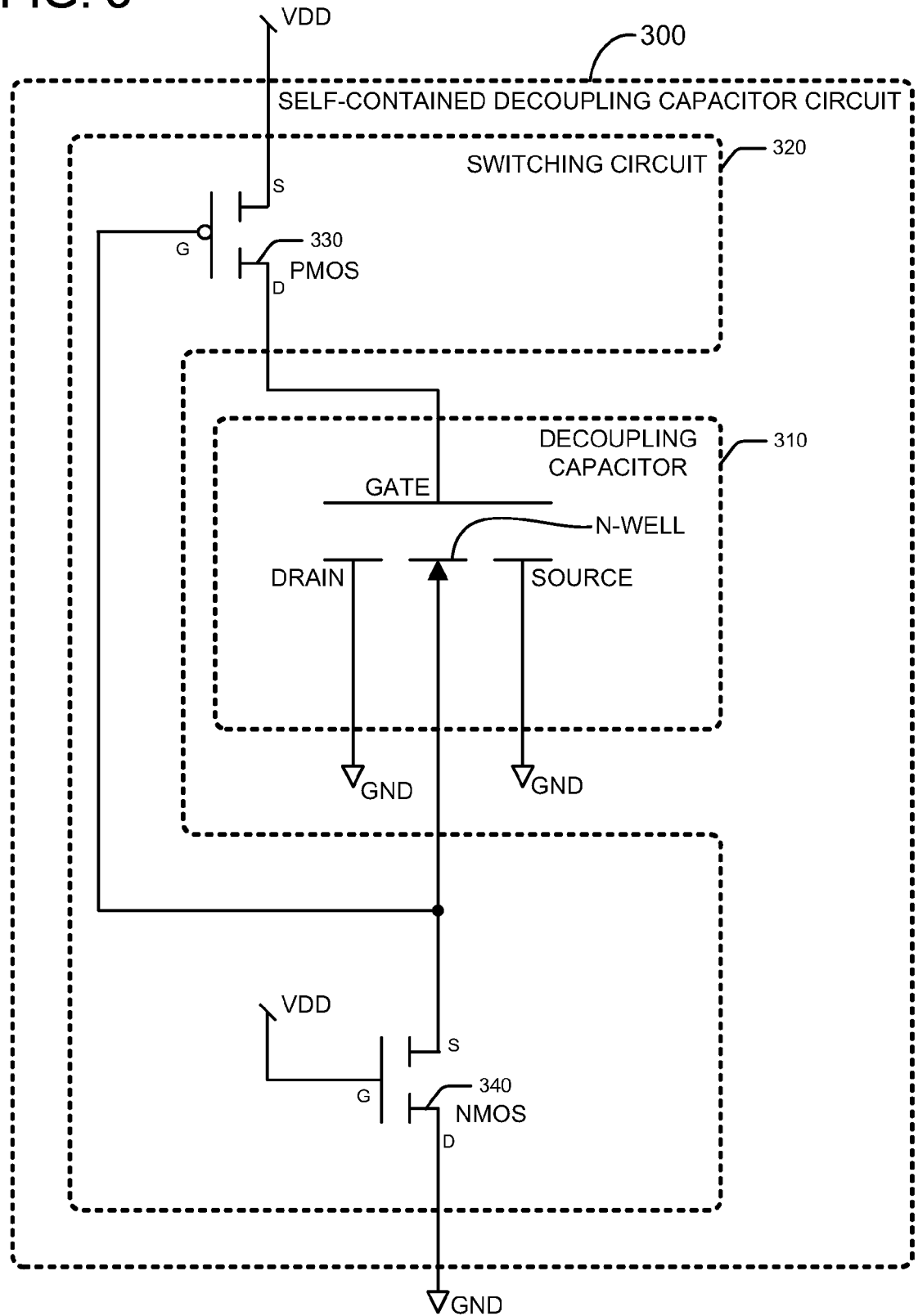
FIG. 3 shows a schematic diagram of the disclosed decoupling capacitor with switching circuit for use in integrated circuits.

FIG. 3 depicts one embodiment of the disclosed decoupling capacitor circuit 300 that an IC designer may employ multiple times on a semiconductor IC substrate. In this particular embodiment, decoupling capacitor circuit 300 includes a decoupling capacitor 310 in the form of an NMOS transistor. Other embodiments may employ a PMOS transistor as decoupling capacitor 310. Decoupling capacitor circuit 300 includes an independent, self-contained switching circuit 320 that effectively disconnects decoupling capacitor 310 from the source VDD and ground GND when decoupling capacitor 310 exhibits substantial leakage current passing therethrough.

Switching circuit 320 includes PMOS transistor 330 and NMOS transistor 340 that couple to one another and other circuitry as shown in FIG. 3. More particularly, the gate of decoupling capacitor 310 couples to the drain of a PMOS transistor 330. The source of PMOS transistor 330 couples to the VDD power supply interconnect on an IC (not shown) that includes multiple decoupling capacitor circuits 300. The VDD power supply interconnect provides voltage to NMOS transistor decoupling capacitor 310 through active PMOS transistor 330. The gate of PMOS transistor 330 couples to the N-well connection of decoupling capacitor 310 and to the source of an NMOS transistor 340. Both drain and source connections on decoupling capacitor 310 couple to GND or ground of the power supply interconnect on the integrated circuit. The gate of NMOS transistor 340 couples to the VDD power supply interconnect. VDD enables NMOS transistor 340 to remain on or active when power to an IC containing decoupling capacitor circuit 300 is on. The drain of the active NMOS transistor 340 couples to GND which is also the ground path for decoupling capacitor 310.

The power supply interconnect voltage VDD pulls the gate of NMOS transistor 340 high. The active NMOS transistor 340 provides a ground path for the N-well connection to NMOS transistor decoupling capacitor 310. NMOS transistor 340 provides the GND source for decoupling capacitor 310 in normal operation namely, acting as a decoupling capacitance. Under normal operation, the voltage at the N-well connection to decoupling capacitor 310 is the drop across the source and drain of NMOS transistor 340 which is typically very low or near zero volts. With the N-well connection voltage of decoupling capacitor 310 thus low, PMOS transistor 330 activates and further provides VDD voltage to the gate of decoupling capacitor 310. In this normal mode of operation, decoupling capacitor 310 operates as a decoupling capacitor between IC power supply interconnect VDD and GND.

If the oxide layer of decoupling capacitor 310 breaks down for any reason, a higher current flow than during normal mode occurs through the N-well substrate connection, thus resulting in a leakage mode of operation. In this leakage mode, the voltage potential at the N-well connection of decoupling capacitor 310 rises above the near zero volts of the normal mode of operation. As the oxide layer of decoupling capacitor 310 decays, the current flow through the N-well connection to GND increases. As the current flow through NMOS transistor 340 to GND increases, the voltage at the N-well connection to decoupling capacitor 310 increases. Eventually the voltage at the N-well connection of decoupling capacitor 310 rises above the gate trigger voltage of PMOS transistor 330, and PMOS transistor 330 turns off. With PMOS transistor 330 inactive, the voltage path between the VDD power interconnect and the gate of decoupling capacitor 310 is no longer present. With voltage thus unavailable to the gate of decoupling capacitor 310, switching circuit 320 effectively switches-out or disconnects decoupling capacitor 310 from the power supply interconnects VDD and GND. In this leakage mode, switching circuit 320 allows no substantial current flow between VDD and GND, thus eliminating the power losses of previous decoupling capacitor circuits such as those of FIG. 2. Decoupling capacitor circuit 300 is self-contained and does not rely on external switching or control signals. Decoupling capacitor circuit 300 provides automatic detection of oxide break down and in response provides automatic switch-out of the decoupling capacitor 410, thus requiring no external control signals. Moreover, in one embodiment, the disclosed decoupling capacitor circuit 300 does not require a power up reset from an internal or external control to charge or control decoupling capacitor 410.

In this embodiment, decoupling capacitor circuit 300 is independent and self-contained because it does not require an external switching or control signal to instruct switching circuit 320 to initially connect decoupling capacitor 310 between the VDD and GND power supply interconnects when it receives supply voltage therefrom. Decoupling capacitor circuit 300 is also independent and self-contained because it does not rely on external switching or control signals to instruct switching circuit 320 when to connect and disconnect decoupling capacitor 310 from the power supply interconnects, namely source VDD and ground GND.

The PMOS transistor 330 and NMOS transistor 340 add capacitance to the entire integrated circuit and thus enhance the decoupling capacitance effect that decoupling capacitor 310 provides. NMOS transistor 340 provides a small resistance in the current path of decoupling capacitor 310 to GND. This resistance represents another feature of this method by providing resistive voltage dampening and thus reducing resonance oscillations in the voltages near decoupling capacitor 310 and proximate devices on the IC. PMOS transistor 330 and NMOS transistor 340 typically require less real estate on the integrated circuit than decoupling capacitor 310. PMOS transistor 330 and NMOS transistor 340 of switching circuit 320 may not require substantial increases in total IC real estate.

Figure 4:
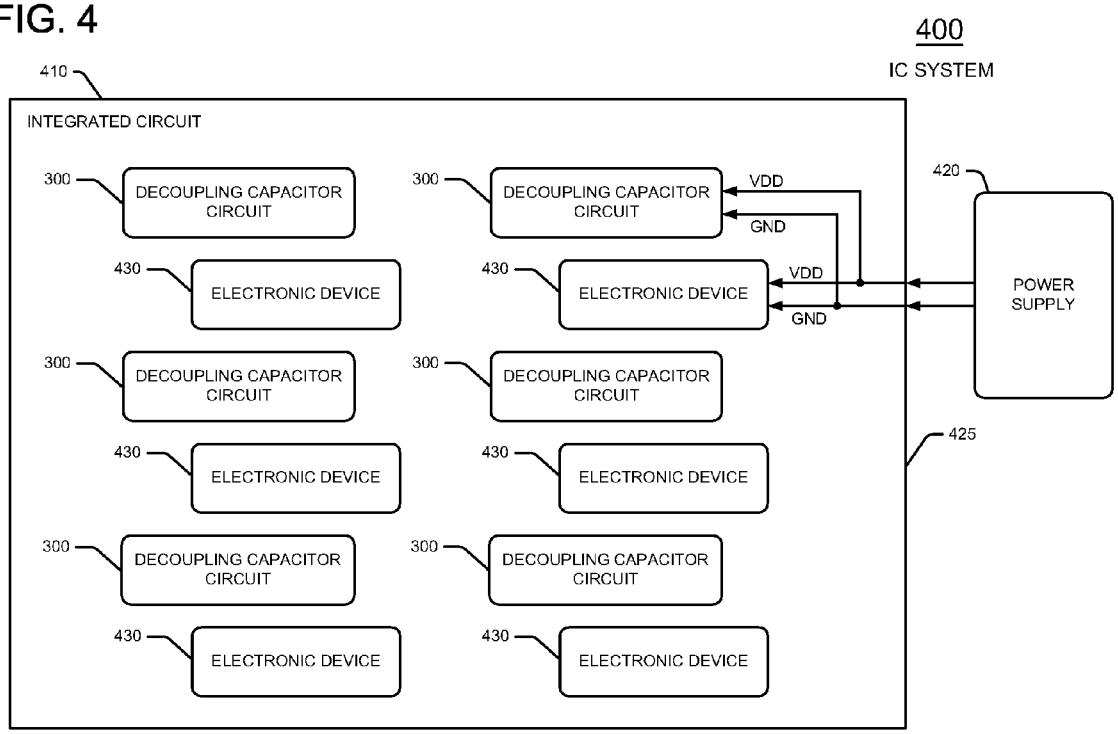
FIG. 4 shows a block diagram of the disclosed integrated circuit using the decoupling capacitor and switching circuit of FIG. 4.

FIG. 4 is a block diagram of an integrated circuit (IC) system 400, namely an IC 410 that couples to power supply 420. Power supply 420 provides the power source connection for both VDD voltage and GND ground to the IC 410 power supply interconnects having the same designation. The power supply interconnects VDD and GND within IC 410 distribute VDD and GND signals to all devices on the IC 410 requiring power resources. IC 410 includes a semiconductor die 425 on which the devices of IC 410 locate.

Integrated circuit 410 contains at minimum one electronic device 430 that requires power from the power supply interconnects VCC and GND of IC 410. IC 410 may contain multiple electronic devices 430 within the real estate of the integrated circuit 410 chip. While due to space limitations FIG. 4 shows VDD and GND interconnects between power supply 420 and one decoupling capacitor circuit 300 and one electronic device 430, in actual practice the VDD and GND interconnects form traces or conductor paths that lead to each decoupling capacitor circuit 300 and each electronic device 430. Each electronic device 430 switching on or off generates noise on the power supply interconnects of IC 410. As shown in FIG. 4, IC 410 includes a decoupling capacitor circuit 300 near each electronic device 430 that generates noise. IC designers will locate as many decoupling capacitor circuits 300 near the electronic devices 430 as design rules and tradeoffs between real estate, power noise reduction, and other design parameters will allow.

Figure 5:
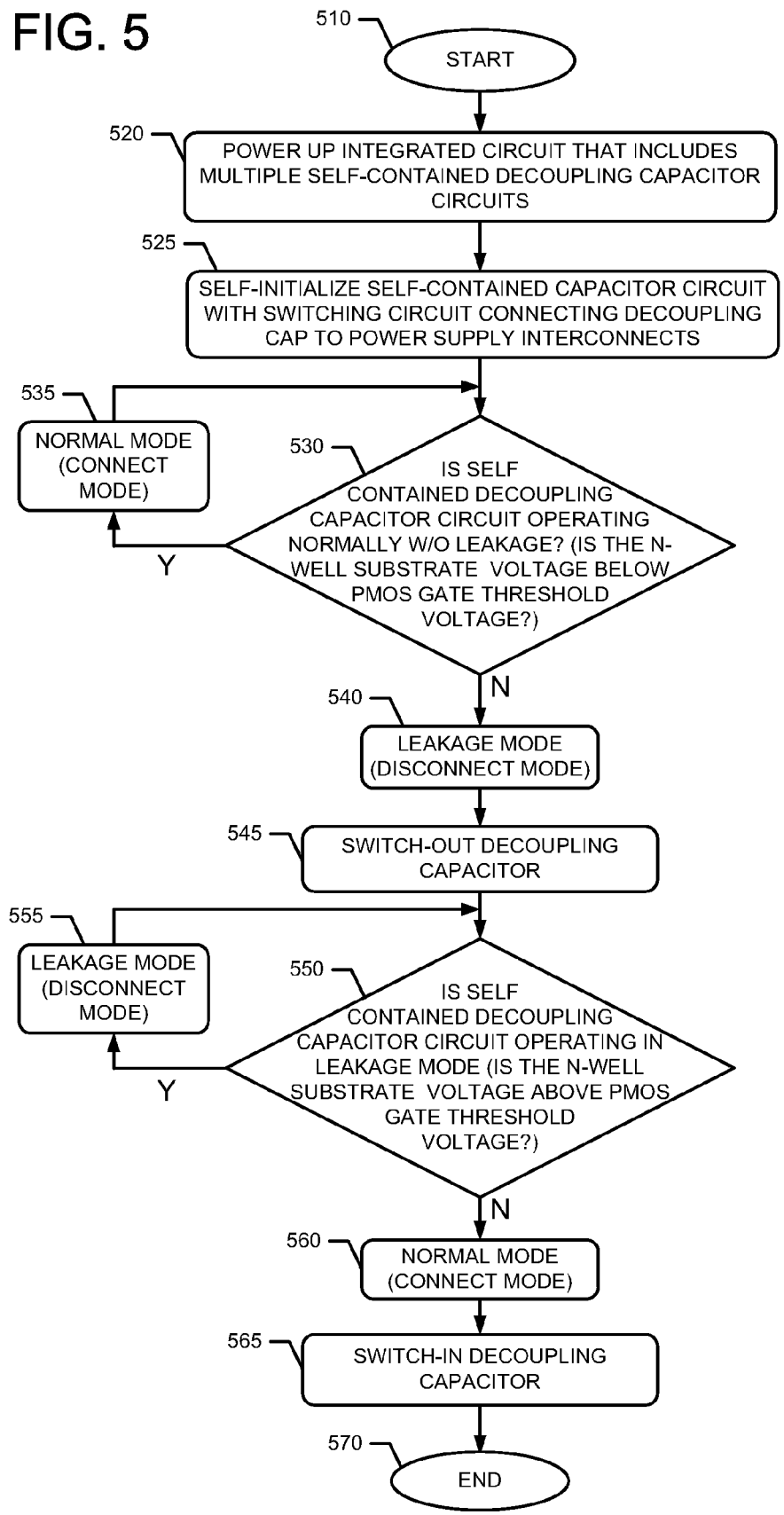
FIG. 5 is a flowchart that depicts the methodology that the disclosed decoupling capacitor and switching circuit employ.

FIG. 5 is a flowchart of a method of operating integrated circuit system 400 that includes multiple independent, self-contained decoupling capacitor circuits 300. The decoupling capacitor circuit methodology begins at start block 510. The IC system 400 powers up by providing VDD and GND resources to the power supply interconnects of IC 410, as per block 520. IC 410 power supply interconnects VDD and GND distribute and provide VDD power and ground GND to decoupling capacitor circuits 300. In response to such power, decoupling capacitor circuits 300 operate in a normal mode or state to provide noise reduction for any electronic devices 430 that operate in relatively close proximity thereto on the semiconductor die 425. Each decoupling capacitor circuit 300 continuously monitors the voltage at the N-well substrate connection of its respective decoupling capacitor 310 to detect decoupling capacitor current leakage, as per decision block 530. Stated alternatively, decision block 530 tests to determine if a self-contained decoupling capacitor circuit 300 presently operates in normal mode (i.e. connect mode) without substantial leakage current. In one embodiment, if the N-well connection voltage remains below the gate threshold of PMOS transistor 330, the decoupling capacitor is operating correctly in normal mode 535 without leakage. In that case, decision block 530 continues testing for leakage over time. However, a bad oxide layer in decoupling capacitor 310 results in higher current flow through the NMOS transistor 340 source to drain path. A higher current flow through NMOS transistor 340, results in a voltage rise at the N-well connection of decoupling capacitor 310. PMOS transistor 330 will turn off when the gate voltage of PMOS transistor 330 exceeds an active threshold level. A negative response at test block 530 thus indicates an oxide layer failure and a resultant leakage current flow. In response to detection of substantial leakage current flow, decoupling capacitor circuit 300 enters a leakage mode (i.e. disconnect mode) 540 that switches out or effectively disconnects decoupling capacitor 310. Switching circuit 320 performs this disconnection by removing the VDD potential to the gate input of decoupling capacitor 310 by turning off PMOS transistor 330, as per block 545. The decoupling capacitor circuit 300 requires no extra reset, trigger, or control signals to continue to remain disconnected in leakage mode.

After the decoupling capacitor 310 disconnects, the decoupling capacitor circuit 300 continues to monitor the leakage current of decoupling capacitor 310. Each decoupling capacitor circuit 300 that switches out in leakage mode continuously monitors the voltage at the N-well substrate connection of its respective decoupling capacitor 310 to detect decoupling capacitor leakage current, as per decision block 550. Decision block 550 tests to determine if a self-contained decoupling capacitor circuit 300 presently operates in leakage mode (i.e. disconnect mode) with leakage current. In one embodiment, if the N-well connection voltage remains above the gate threshold of PMOS transistor 330, the decoupling capacitor is operating in leakage mode 555 and remains in leakage mode (disconnect mode). In that case, decision block 550 continues testing for a potential recovery or lower leakage current over time. A good oxide layer in decoupling capacitor 310, results in lower current flow through the NMOS transistor 340 source to drain path. A lower current flow through NMOS transistor 340 results in a voltage drop at the N-well connection of decoupling capacitor 310. PMOS transistor 330 will turn on when the gate voltage of PMOS transistor 330 drops to an active low threshold level. A negative response at test block 550 thus indicates an oxide layer recovery and a resultant lack of substantial leakage current flow. In response to detection of no substantial leakage current flow, decoupling capacitor circuit 300 enters the normal mode (i.e. connect mode) 560 that effectively re-connects, or switches back in, decoupling capacitor 310. Switching circuit 320 performs this re-connection by applying the VDD potential to the gate input of decoupling capacitor 310 thus turning on PMOS transistor 330, as per block 565. The decoupling capacitor circuit 300 requires no extra reset, trigger, or control signals to continue to remain connected in normal mode. The decoupling capacitor switching method ends, as per end block 570. If the IC system 400 powers down and back up, the process restarts for each independent and automatic decoupling capacitor circuit 300, as again per start block 510. In actual practice, when the method reaches end block 570, process flow may continue back to start block 510 to begin the method anew.

In one embodiment, the decoupling capacitor circuit self-initializes in the connect mode without external control signals and is thus self-contained. Because of the self-contained nature of the decoupling capacitor circuit, an integrated circuit may contain an array of decoupling capacitor circuits, such as shown in FIG. 4, without the expenditure of substantial semiconductor chip real estate for respective decoupling capacitor control lines.

Modifications and alternative embodiments of this invention will be apparent to those skilled in the art in view of this description of the invention. Accordingly, this description teaches those skilled in the art the manner of carrying out the invention and is intended to be construed as illustrative only. The forms of the invention shown and described constitute the present embodiments. Persons skilled in the art may make various changes in the shape, size and arrangement of parts. For example, persons skilled in the art may substitute equivalent elements for the elements illustrated and described here. Moreover, persons skilled in the art after having the benefit of this description of the invention may use certain features of the invention independently of the use of other features, without departing from the scope of the invention.

What is claimed is:

1. A method of decoupling electronic devices in an integrated circuit, the method comprising:

providing the integrated circuit with a plurality of electronic devices situated on a semiconductor die;

providing a self-contained switchable decoupling capacitor (SCSDC) circuit adjacent at least one of the plurality of electronic devices;

coupling the SCSDC circuit between first and second power supply interconnects adjacent the at least one of the plurality of electronic devices, the SCSDC circuit including a decoupling capacitor that couples to a switching circuit internal to the SCSDC circuit, the switching circuit being coupled between the first power supply interconnect and the decoupling capacitor, the switching circuit being further coupled between the decoupling capacitor and the second power supply interconnect, wherein the switching circuit operates in a connect mode to connect the decoupling capacitor to the first and second power supply interconnects and in a disconnect mode to disconnect the decoupling capacitor from at least one of the first and second power supply interconnects;

thereafter controlling the operation of the SCSDC circuit by:

self-initializing, by the SCSDC circuit, the switching circuit in the connect mode when power is applied to the first and second power supply interconnects;

monitoring, by the switching circuit within the SCSDC circuit, leakage across the decoupling capacitor in the SCSDC circuit; and switching, by the switching circuit, to the disconnect mode in response to the monitoring step detecting leakage across the decoupling capacitor.

2. The method of claim 1, further comprising:

continuing monitoring, by the switching circuit within the SCSDC circuit while the switching circuit is in the disconnect mode, leakage across the decoupling capacitor; and switching, by the switching circuit, back to the connect mode in response to the continuing monitoring step detecting a return to no substantial leakage across the decoupling capacitor in the SCSDC circuit.

3. The method of claim 1, wherein the monitoring step includes sensing voltage at the decoupling capacitor to determine leakage through the decoupling capacitor.

4. The method of claim 1, wherein the first power supply interconnect is a voltage supply.

5. The method of claim 4, wherein the second power supply interconnect is ground.

6. An integrated circuit, comprising:

a semiconductor die;

a plurality of electronic devices situated on the semiconductor die;

first and second power supply interconnects adjacent at least one of the plurality of electronic devices;

a self-contained switchable decoupling capacitor (SCSDC) circuit adjacent the at least one of the plurality of electronic devices, the SCSDC circuit being coupled between the first and second power supply interconnects, the SCSDC circuit including internal thereto:

a decoupling capacitor;

a switching circuit, coupled to the decoupling capacitor such that the switching circuit is coupled between the first power supply interconnect and the decoupling capacitor, the switching circuit being further coupled between the decoupling capacitor and the second power supply interconnect, wherein the switching circuit operates in a connect mode to connect the decoupling capacitor to the first and second power supply interconnects and in a disconnect mode to disconnect the decoupling capacitor from at least one of the first and second power supply interconnects;

wherein the SCSDC circuit self-initializes the switching circuit in the connect mode when power is applied to the first and second power supply interconnects, the switching circuit monitoring leakage across the decoupling capacitor so that in response to detecting leakage across the decoupling capacitor the switching circuit switches to the disconnect mode.

7. The integrated circuit of claim 6, wherein a power supply is coupled to the first and second power supply interconnects.

8. The integrated circuit of claim 6, wherein the switching circuit continues to monitor leakage across the decoupling capacitor while the switching circuit is in the disconnect mode.

9. The integrated circuit of claim 8, wherein the switching circuit switches back to the connect mode in response to the switching circuit detecting a return to no substantial leakage across the decoupling capacitor.

10. The integrated circuit of claim 6, wherein the switching circuit includes a first transistor that senses voltage at the decoupling capacitor to determine leakage.

11. The integrated circuit of claim 6, wherein the first power supply interconnect is a voltage supply.

12. The integrated circuit of claim 6, wherein the second power supply interconnect is ground.

13. An integrated circuit, comprising:

a semiconductor die;

a plurality of electronic devices situated on the semiconductor die;

first and second power supply interconnects situated adjacent each of the plurality of electronic devices;

a plurality of self-contained switchable decoupling capacitor (SCSDC) circuits, a respective SCSDC circuit being situated adjacent each of the plurality of electronic devices, the plurality of SCSDC circuits being coupled between the first and second power supply interconnects, each SCSDC circuit including internal thereto:

a decoupling capacitor;

a switching circuit, coupled to the decoupling capacitor such that the switching circuit is coupled between the first power supply interconnect and the decoupling capacitor, the switching circuit being further coupled between the decoupling capacitor and the second power supply interconnect, wherein the switching circuit operates in a connect mode to connect the decoupling capacitor to the first and second power supply interconnects and in a disconnect mode to disconnect the decoupling capacitor from at least one of the first and second power supply interconnects;

wherein the SCSDC circuit self-initializes the switching circuit in the connect mode when power is applied to the first and second power supply interconnects, the switching circuit monitoring leakage across the decoupling capacitor so that in response to detecting leakage across the decoupling capacitor the switching circuit switches to the disconnect mode.

14. The integrated circuit of claim 13, wherein a power supply is coupled to the first and second power supply interconnects.

15. The integrated circuit of claim 13, wherein the switching circuit in each SCSDC circuit continues to monitor leakage across the decoupling capacitor of that SCSDC circuit while the switching circuit of that SCSDC circuit is in the disconnect mode.

16. The integrated circuit of claim 15, wherein the switching circuit of a particular SCSDC circuit switches back to the connect mode in response to the switching circuit of the particular SCSDC circuit detecting a return to no substantial leakage across the decoupling capacitor of the particular SCSDC circuit.

17. The integrated circuit of claim 13, wherein each switching circuit includes a first transistor that senses decoupling capacitor voltage to determine coupling capacitor leakage.

18. The integrated circuit of claim 13, wherein the first power supply interconnect is a voltage supply.

19. The integrated circuit of claim 13, wherein the second power supply interconnect is ground.

* * * * *